(12) United States Patent
Killat

(10) Patent No.: US 8,531,238 B2
(45) Date of Patent: Sep. 10, 2013

(54) MULTI-STAGE FULLY DIFFERENTIAL AMPLIFIER WITH CONTROLLED COMMON MODE VOLTAGE

(75) Inventor: Dirk Killat, Cottbus (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 58 days.

(21) Appl. No.: 13/347,918

(22) Filed: Jan. 11, 2012

(65) Prior Publication Data

US 2013/0169361 A1 Jul. 4, 2013

(30) Foreign Application Priority Data

Dec. 30, 2011 (EP) .................................... 11392010

(51) Int. Cl.
H03F 1/02 (2006.01)
(52) U.S. Cl.
USPC ................................................ 330/9; 327/124
(58) Field of Classification Search
USPC ..................... 330/9, 69, 254; 327/124, 307
See application file for complete search history.

(56) References Cited

U.S. PATENT DOCUMENTS

| | | | |
|---|---|---|---|
| 5,493,253 A | 2/1996 | Ogou | |
| 6,084,474 A | 7/2000 | Lee | |
| 6,252,458 B1 | 6/2001 | Shibata | |
| 6,262,626 B1 | 7/2001 | Bakker et al. | |
| 6,466,081 B1 | 10/2002 | Eker | |
| 6,911,864 B2 | 6/2005 | Bakker et al. | |
| 7,317,356 B2 | 1/2008 | Ananth | |
| 7,538,606 B2 * | 5/2009 | Ripley | 330/9 |
| 7,719,351 B2 * | 5/2010 | Pertijs et al. | 330/9 |
| 7,795,960 B2 | 9/2010 | Lyden et al. | |
| 7,834,685 B1 * | 11/2010 | Pertijs | 330/9 |
| 7,847,628 B2 | 12/2010 | Denison | |
| 2002/0014918 A1 | 2/2002 | Schrodinger et al. | |
| 2006/0055444 A1 | 3/2006 | Ogasawara | |
| 2008/0218199 A1 | 9/2008 | Matsushima | |
| 2010/0060352 A1 * | 3/2010 | Kusuda et al. | 330/9 |

FOREIGN PATENT DOCUMENTS

| | | |
|---|---|---|
| DE | 19639034 | 4/1998 |
| JP | 05252020 | 9/1993 |

OTHER PUBLICATIONS

European Search Report, App. No. 11392010.2-2215, Mail Date Jul. 5, 2012, May 7, 2012.
"A 40 mW 3 Gb/s Self-Compensated Differential Transimpedance Amplifier With Enlarged Input Capacitance Tolerance in 0.18 um CMOS Technology," by Chia-Ming Tsai, IEEE Journal of Solid-State Circuits, vol. 44, No. 10, Oct. 10, 2009, pp. 2671-2677.

(Continued)

Primary Examiner — Henry Choe
(74) Attorney, Agent, or Firm — Saile Ackerman LLC; Stephen B. Ackerman

(57) ABSTRACT

Disclosed are systems and methods to achieve a low noise, fully differential amplifier with controlled common mode voltages at each stage output but without the requirement of a common mode feedback loop. Common mode voltages are adjusted by adjusting the currents flowing through the load impedances (bias currents) wherein the currents are derived from one or more voltage-to-current converters based on an impedance that matches to the load impedances of the stages of the amplifier. The amplifier invented is primarily used for amplification of low frequency signals. The amplifier has one or more gain stages applying only one conduction type of transistors of an IC technology that has the lowest transition frequency between 1/f noise and white noise to achieve a low chopping or autozeroing frequency.

55 Claims, 5 Drawing Sheets

(56) References Cited

OTHER PUBLICATIONS

"Circuit Techniques for Reducing the Effects of Op-Amp Imperfections: Autozeroing, Correlated Double Sampling, and Chopper Stabilization," By Christian C. Enz et al., Proceedings of the IEEE, vol. 84, No. 11. Nov. 1996, pp. 1584-1614.

K. Makinwa: Dynamic Offset-Cancellation Techniques. TU-Deltf, Presentation at Smart Sensor Systems 2002, pp. 1-42.

"A CMOS Chopper Offset-Stabilized Opamp," by Johan F. Witte et al., IEEE Journal of Solid-State Circuits, vol. 42, No. 7, Jul. 2007, pp. 1529-1535.

"A CMOS Chopper Amplifier," by Christian C. Enz et al., IEEE Journal of Solid-State Circuits, vol. SC-22, No. 3, Jun. 1987, pp. 335-342.

C.A. Gobet: Spectral Distribution of a Sampled 1st-Order Lowpass Filtered White Noise. Electronics letters, vol. 17, No. 19, Sep. 17, 1981, pp. 720-721.

\* cited by examiner

MULTI-STAGE FULLY DIFFERENTIAL AMPLIFIER WITH CONTROLLED COMMON MODE VOLTAGE

BACKGROUND OF THE INVENTION (1) Field of the Invention

This invention relates generally to amplifiers and relates more specifically to low-noise CMOS amplifiers primarily for amplification of low frequency signals.

(2) Description of the Prior Art

Low noise amplifiers realized in CMOS technologies must suppress 1/f-noise and DC-offset if low frequency signals need to be processed. 1/f noise or Pink noise is a signal or process with a frequency spectrum such that the power spectral density is inversely proportional to the frequency, wherein white is the noise that has constant magnitude of power over frequency. The practice is the use of chopping or autozeroing (correlated double sampling of input offset) to eliminate the 1/f noise. The achievable noise limit by use of autozeroing is about 10 to 15 dB above the white noise of the amplifier of the Autozero circuit. This is a result of undersampling of white band noise. Chopper amplifiers have a noise limit equal to the white noise of the continuous time amplifier. The reason is that chopping is not a sampling process, but a modulation.

Chopper amplifiers exhibit the problem of gain errors due to settling if the input signal is chopped, and residual low frequency and DC-offset due to asymmetric settling time of the positive and negative chopping clock slope. Techniques like guard banding and nested chopping, or chopping combined with autozeroing are used to eliminate such residual offset. Also the gain can be calibrated or the demodulation can be adjusted in phase to minimize such errors.

It is a challenge for the designers of amplifiers to achieve low noise density below, i.e. eliminate practically 1/f noise.

There are known patents dealing with low noise amplifiers:

U.S. Patent (U.S. Pat. No. 7,795,960 to Lyden et al.) discloses a low power, low noise amplifier system including at least one amplifier having first and second differential input terminals, first and second differential output terminals and providing a differential output; first and second input capacitors interconnected with the first and second differential amplifier input terminals; first and second feedback circuits containing first and second feedback capacitors, respectively, interconnected with the amplifier differential input and output terminals; an input chopper switch circuit for receiving a low frequency differential input and selectively, alternately swapping those low frequency differential inputs through the input capacitors to the differential input terminals of the amplifier; an output chopper switch for receiving and selectively, alternately swapping the amplifier differential outputs synchronously with the input chopper switch circuit; and a low pass filter responsive to the swapped differential outputs for providing a low noise, low power amplification of the low frequency differential inputs.

U.S. Patent (U.S. Pat. No. 7,317,356 to Anath) teaches an amplifier circuit allowing for practical integrated circuit implementation of a DC-blocked, low-noise differential amplifier capable of amplifying ultra low-frequency signals and amplitudes ranging upwards of a few microvolts. DC-blocking capacitors having a capacitance value close to that of the effective input capacitance of the low-noise amplifier's inputs can be used by incorporating a positive feedback mechanism that tracks any variations in the amplifier gain or integrated circuit's technology process and lowers or cancels the input parasitic capacitances. Advantageously, the parasitic capacitance of transistors, typically field effect transistors, located on an integrated circuit chip is used in the feedback mechanism. This reduces the capacitive voltage division loss of the signal at the input of the amplifier while still allowing for the use of very small values of DC-blocking capacitance. No other active elements other than the amplifier itself are required to attain a low area, integrated circuit implementation of a DC-blocked, yet ultra low-frequency high pass filtered, low-noise amplifier.

U.S. Patent (U.S. Pat. No. 7,847,628 to Denison) proposes a chopper stabilized instrumentation amplifier. The amplifier is configured to achieve stable measurements at low frequency with very low power consumption. The instrumentation amplifier uses a differential architecture and a mixer amplifier to substantially eliminate noise and offset from an output signal produced by the amplifier. Dynamic limitations, i.e., glitching, that result from chopper stabilization at low power are substantially eliminated through a combination of chopping at low impedance nodes within the mixer amplifier and feedback. The signal path of the amplifier operates as a continuous time system, providing minimal aliasing of noise or external signals entering the signal pathway at the chop frequency or its harmonics. The amplifier can be used in a low power system, such as an implantable medical device, to provide a stable, low-noise output signal.

U.S. Patent Publication (US 2001/0011923 to Bakker et al.) and U.S. Patent (U.S. Pat. No. 6,262,626 to Bakker et al.) teach an amplifier provided with a pair of choppers in order to reduce the DC-offset and the noise produced by the amplifier. To obtain an optimal noise reduction the pair of choppers operate on a high frequency. As a result the DC-offset cancellation is not optimal because a so-called charge injection of the switches in the pair of choppers produces a DC-offset. To overcome this problem the amplifier is further provided with further offset cancellation means which are for example formed by a further pair of choppers. This further pair of choppers operates on a relatively low frequency. The combination of the pair of choppers and the further pair of choppers guarantees an optimal DC-offset cancellation as well as an optimal noise cancellation.

Furthermore the following publications are known:

C. C. Enz, G. C. Temes: Circuit Techniques for Reducing the effects of OP-Amp imperfections: Autozeroing Correlated double Sampling, and Chopper Stabilization. Proceedings of the IEEE, Vol. 84, No. 11, November 1996.

K. Makinwa: Dynamic Offset-Cancellation Techniques. TU-Delft. Presentation at Smart Sensor Systems 2002.

C. C. Enz, E. A. Vittoz, F. Krummenacher: A CMOS A Chopper Amplifier, IEEE Journal of Solid-State Circuits, Vol. SC-22, No. 3, June 1987.

C. A. Gobet: Spectral Distribution of a sampled $1^{st}$ order lowpass filtered with noise. Electronics letters, Vol. 17, no. 19, Sep. 17, 1981

J. F. Witte, K. A. A. Makinwa, J. H. Huijsing: A CMOS Chopper Offset-Stabilized OP-Amp. IEEE Journal of Solid-State Circuits, Vol. SC-42, No. 7, July 2007.

SUMMARY OF THE INVENTION

A principal object of the present invention is to achieve a low noise amplifier.

A further object of the invention is to achieve a low noise amplifier capable to amplify low frequency signals.

A further object of the invention is to achieve an amplifier having controlled common voltages at each stage output without requiring a common mode feedback loop.

A further object of the invention is to achieve an amplifier having a low noise density of below 30 Nv/Hz.

A further object of the invention is to achieve an amplifier eliminating 1/f noise and minimize white noise.

A further object of the invention is to achieve an amplifier enabling a common mode input enclosing VSS.

A further object of the invention is to achieve an amplifier having a low chopping frequency of below 1 kHz.

A further object of the invention is to achieve an amplifier having a fully differential path with no-inverting amplifier configuration.

A further object of the invention is to achieve an amplifier wherein gain stages having no junction capacitances to substrate.

A further object of the invention is to achieve an amplifier wherein high-frequency non-dominant poles allow compensation of multi-gain stage.

A further object of the invention is to achieve an amplifier wherein high-frequency non-dominant poles are achieved by using resistive load.

A further object of the invention is to achieve an amplifier having an exact adjustment of common mode of resistor load and common mode input by matched Voltage/Current (V/I) converter.

Furthermore an object of the invention is to minimize noise by connecting the load resistors to a special signal ground.

In accordance with the objects of this invention a method to achieve a fully differential low noise amplifier with controlled common mode voltages suited for amplification of low frequency signals is disclosed, The method invented firstly comprises the following steps: (1) providing a fully differential amplifier having one or more gain stages comprising at least one voltage-to-current converter each comprising an impedance defining the voltage to current ratio, wherein the impedance of the voltage-to-current converter matches the load impedances of the one or more gain stages, (2) applying only one type of transistors of an IC technology that has the lowest transition frequency between 1/f noise and white noise to achieve a low chopping or autozeroing frequency, and (3) deploying load impedances with each gain stage, Furthermore the method disclosed comprises the steps of: (4) adjusting common mode voltages by adjusting currents flowing through said load impedances, wherein the currents flowing through the load impedances are derived from the at least one voltage-to-current converter and wherein no common mode feedback loop is required, (5) setting the common mode voltage at the load impedances of a first stage small enough so that the input common mode range encloses the ground potential, and (6) connecting the load impedances to a special signal ground.

In accordance with the objects of this invention a fully differential amplifier with at least one gain stage and a controlled common mode voltage is disclosed. The amplifier invented, comprises: at least one gain stage that is built of a differential transconductance connected to a load impedance, wherein the differential transconductance is connected to the input of the gain stage, and the output of the differential transconductance and the load impedance are connected to the output of the gain stage, and at least one voltage-to-current converter comprising an impedance defining a voltage to current ratio, where the impedance of the at least one voltage-to-current converter matches with the load impedance of one or a number of gain stages, wherein common mode voltages are adjusted by adjusting currents flowing through the load impedances, whereupon the currents are derived from said at least one voltage-to-current converter based on an impedance that matches to the load impedance of the at least one gain stage of the amplifier, and wherein the common mode voltage is controlled without requiring a means to measure the output common mode voltage.

In accordance with the objects of this invention a low-noise amplifier suited for amplification of low frequency signals has been disclosed. The amplifier invented comprises, firstly: an input port for a positive signal, an input port for a negative signal, one or more voltage-to-current (V/I) converters providing currents to set a DC operating point of load resistors of one or more gain stages, wherein each V/I converter comprises an input port for a reference voltage and a reference resistor, wherein the reference resistor is of a same type as all load resistors, and said one or more fully differential gain stages, wherein all transistors of said at least two gain stages are PMOS transistors and each gain stage has exclusively all said matched load resistors for load, each load resistor has one terminal connected to a signal ground, and wherein each gain stage comprises at least one transconductance. Furthermore the amplifier discloses a chopping switch at the input and at the output of the amplifier, a positive output node, a negative output node, and a feedback circuit comprising a voltage divider, formed by splitting the load resistors of an output gain stage, feeding back a fraction of the output voltages, wherein the fraction of the positive and negative output voltages is an input of a fully differential transconductance, which is in parallel to the transconductance of the first gain stage and is feeding the same load resistors as the transconductance of the first gain stage.

BRIEF DESCRIPTION OF THE DRAWINGS

In the accompanying drawings forming a material part of this description, there is shown.

DESCRIPTION OF THE PREFERRED EMBODIMENTS

Figure 1:
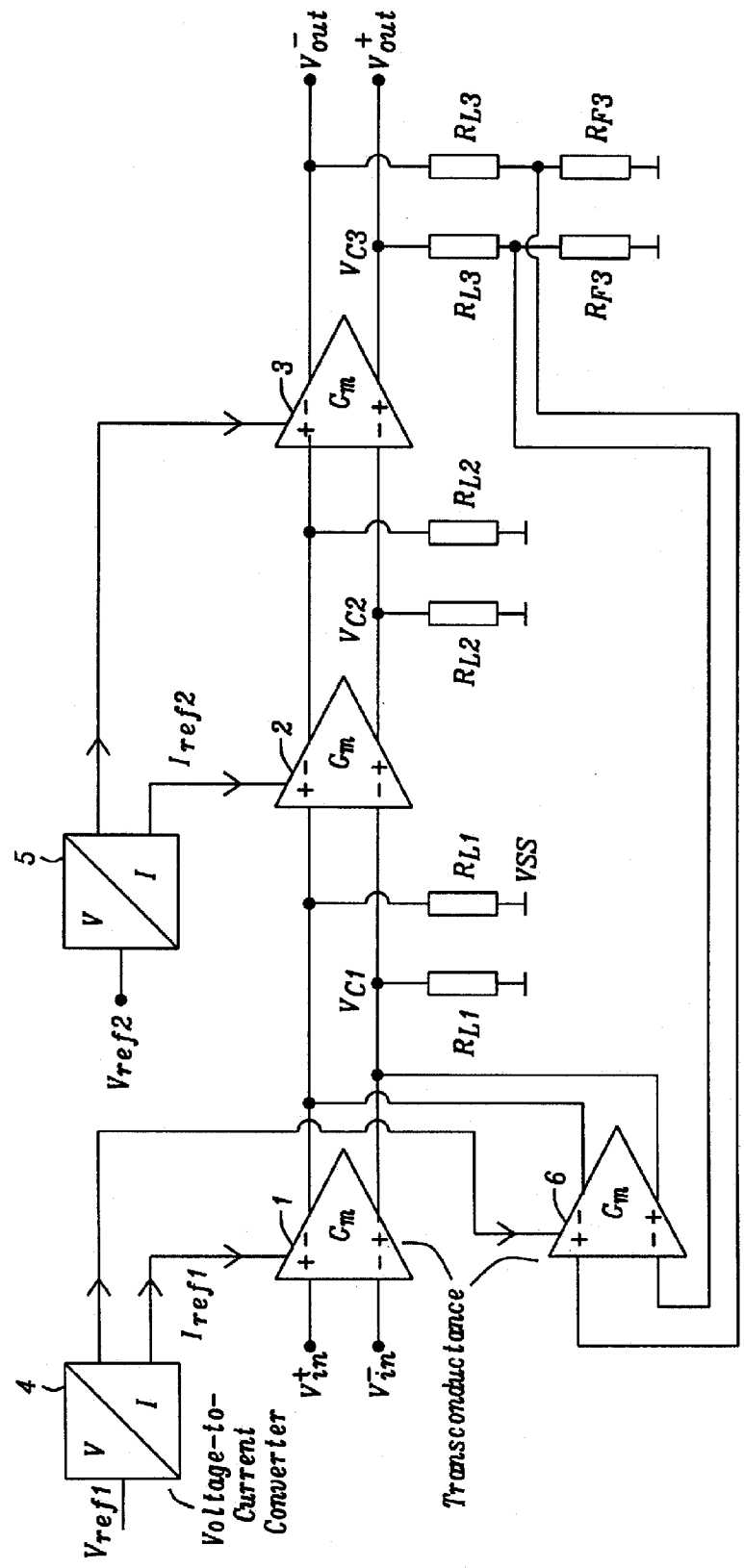
FIG. 1 illustrates a block diagram showing basic functions of a preferred embodiment of the invention having three gain stages 1-3.

Circuits and methods for achieving a low-noise amplifier, which can be primarily used for amplifying low frequency signals, are disclosed.

A preferred embodiment of the invention discloses an amplifier amplifying low frequency signals in the range of 0-500 Hz to minimize residual offset, non-linearity and gain errors. A prerequisite is a low transition frequency between 1/f-noise and white noise. This can be achieved if only PMOS transistors are used in the amplifier circuit, as the PMOS transistors exhibit lower 1/f-noise than NMOS transistors. In the preferred embodiment of the invention resistors are used as load impedances. Alternatively transistors operating as resistors, inductors, diodes, transistors operating as diodes, or MOS diodes could be used as load impedances. The problem of the low gain bandwidth product is circumvented using more than one gain stage, e.g. three gain stages. Therefore the amplifier disclosed has a very low noise density, namely below 30 nV/$\sqrt{Hz}$. This means that for low frequencies, i.e. in the range of 0-500 Hz, 1/f noise is practically eliminated.

The common mode range at the resistive load is adjusted by a matched Voltage-to-current converter, allowing exact adjustment of the common mode voltage at the load resistors. Another advantage is that the PMOS input spans the negative supply rail, which is advantageous if small signals at GND are measured.

A differential input is usually achieved by using an inverting input, but an inverting input is not free of bias currents, which would increase 1/f-noise if NMOS transistors were used in the chopping input transfer gates. The amplifier disclosed here has two input stages in parallel connected to the same resistive load to make a fully differential input that is free of input bias current. Another advantage of the resistive load is that it has no junction capacitance to the substrate. The resistive load working against ground can be tied together to a separate signal ground, which is separate from the grounds of a mixed-signal integrated circuit. This improves the robustness against noise.

The amplifier of the present invention is a multi-stage differential amplifier with controlled common mode voltage at each gain stage output but without the requirement of a common mode feedback loop and is characterized by the following features:

- Common mode voltages are adjusted by adjusting the currents flowing through the load impedances (bias currents), whereupon the currents are derived from a voltage-to-current (V/I) converter based on an impedance that matches to the load impedances of the stages of the amplifier.
- Having in a preferred embodiment a MOS transistor differential input stage and resistors used as load impedances.
- Application of only one MOS transistor polarity in the input stage that compromises the best noise characteristics, e.g. PMOS are preferred to NMOS.
- Application of more than one gain stage to achieve high open loop gain.
- Setting of DC operating point of load resistors by use of at least one separate matched V/I-converter.
- Setting the DC operating point of load resistors to a (low) level that enables inclusion of the supply rail level to the common mode input range.
- Use of two input stages in parallel or two amplifiers in parallel to enable fully differential input without the necessity of an inverting amplifier configuration showing input bias current.
- Connecting the load resistors to a separate supply rail, e.g. a special signal ground.

FIG. 1 illustrates a block diagram showing basic functions of a preferred embodiment of the invention having three gain stages 1-3, wherein each gain stage comprises at least one Transconductance having low gain and low impedance. It should be noted that using three gain stages is only a non-limiting example of the invention. Another number of gain stages could be used as well.

The common mode voltage control for the common mode voltages Vc1-Vc3 is performed with a first voltage-to current (V-I)-converter 4 and a $1^{st}$ reference voltage Vref1 adjusting the common mode voltage of the $1^{st}$ gain stage 1, and a $2^{nd}$ reference voltage Vref2 and a second V-I-converter 5 adjusting the common mode voltage Vc2 and Vc3 of the $2^{nd}$ and $3^{rd}$ gain stage 2-3 (Chopping switches are not shown in FIG. 1 to avoid unnecessary complexity). According to the well-known equation (V=R×I) the product of resistance values of the load resistors RL1, RL2 and RL3 multiplied with the bias current of the respective Gm is increased from gain stage to gain stage in order to increase the common mode voltages of each gain stage. In the preferred embodiment the common mode voltage Vc1 is about 600 mV, Vc2 is about 800 mV, and Vc3 is about 1V. The current provided by the one or more V-I converters are in the order of magnitude of 75 µA. All load resistors inclusive a reference resistor Rref of the V-I converter shown in FIG. 3a are matched resistors built using the technology. Therefore no common mode current measurement and correspondent regulation loop is required.

Also a feedback configuration is deployed. The feedback configuration of the embodiment shown in FIG. 1 comprises the voltage dividers of resistors RL3 and RF3 at the $3^{rd}$ (last) stage 3 of the 3-stage amplifier, feedback of the voltages from the voltage dividers to differential inputs of Gm 6, and feeding the differential output currents of Gm 6 to both nodes Vc1. The load resistors can be split by implementing an intermediate tap to form a voltage divider to feed back a fraction of the output voltage. The feedback loop is closed at the input using a $2^{nd}$ OTA 6 in parallel to the OTA 1 of the feed forward path.

Figure 3:
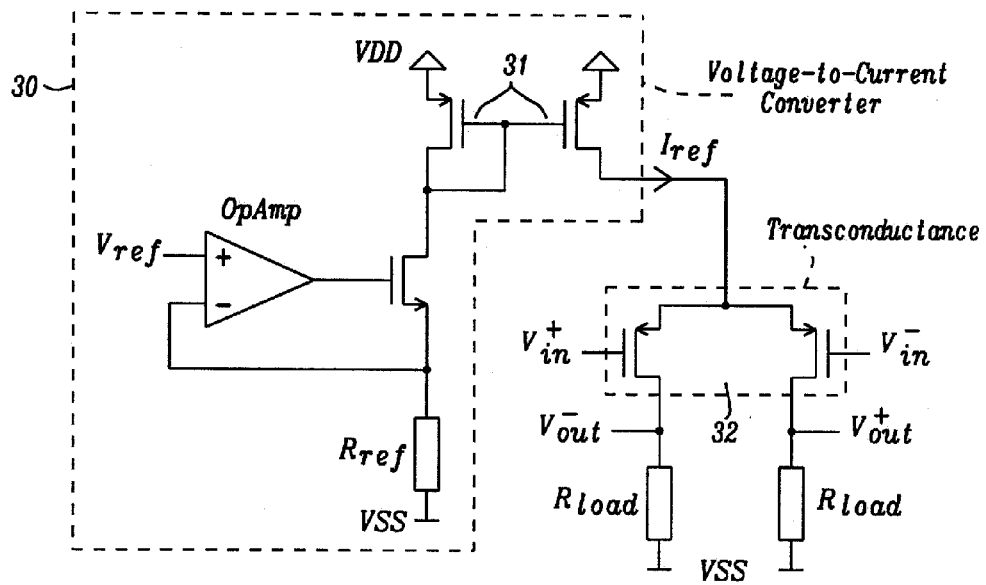
FIG. 3 illustrates a preferred embodiment of a voltage to current (V-I) converter connected to a transconductance (differential stage) with resistor load.

The parallel configuration of the two OTAs 1 and 6 can be realized by parallel connection of the differential outputs of the OTAs 1 and 6 to the same load resistors (as shown in FIG. 1), or by parallel connection of the two transconductances 1 and 6 (i.e. 2 differential pairs of transistors), at their 3 current conducting (i.e. source or drain) terminals (that are then differing to the configuration option shown in the figure connected with their source node to the same current source as well). A preferred embodiment of an OTA is shown in FIG. 3 in detail. This $2^{nd}$ option works however only if the common mode voltage of the input signal and the feedback signal are identical.

Each of the three gain stages shown in FIG. 1 is generating very low noise but has a relatively low gain. Therefore three gain stages are deployed in a preferred embodiment of the invention in order to achieve a gain in the range of 20 dB. Other numbers of gain stages could be deployed as well; the number of gain stages should be higher than one.

Figure 4:
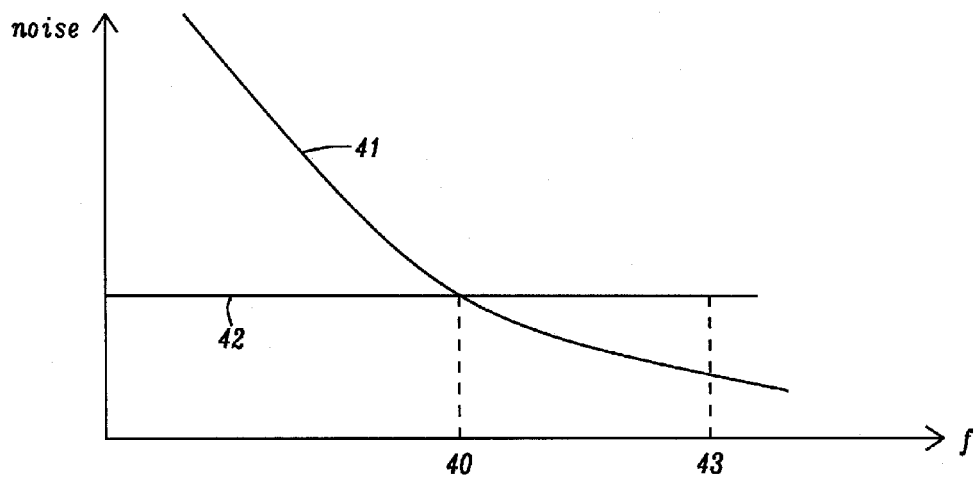
FIG. 4 illustrates a white noise curve and a 1/f noise curve depending upon the frequency.

A significant advantage of the circuit invented is that each gain stage has a low impedance and high bandwidth and by using PMOS technology in the preferred embodiment there are no junction capacitances to substrate and consequently there is no 1/f noise from the substrate. Generally only one type of transistors of an IC-technology is to be used, that has the lowest transition frequency between 1/f-noise and white noise to achieve a low chopping or autozeroing frequency. This transition is illustrated in FIG. 4. Furthermore due to low gain of each stage, resistive load, and high bandwidth A/C compensation can be performed very efficiently by a simple R/C network for 10-20 kHz in one stage.

In this design the $3^{rd}$ stage has the smallest bandwidth and makes the dominant pole. Compensation is accomplished by adding a differential capacitor at the output. Fortunately the output resistors R_L3 and R_F3 are high, so the capacitor value is moderate. For 70-degree phase margin the $2^{nd}$ and $3^{rd}$ poles must be above 3 times the guaranteed bandwidth (GBW). There is no exact ratio between $1^{st}$ and high order poles; it depends on the GBW and the gain required in closed loop. The compensation capacitors can be differentially connected to the output nodes of the last transconductance stage, or/and at RC low pass at the input of an intermediate Gm input The load resistors are contributing significantly to avoiding 1/f noise because they have no junction capacitance and are therefore not subject of any frequency dependent noise. They are also tied together at a special signal ground level.

Using resistor load and a low gain of each amplifier stage contributes to an excellent PSSR of the amplifier disclosed.

Figure 2:
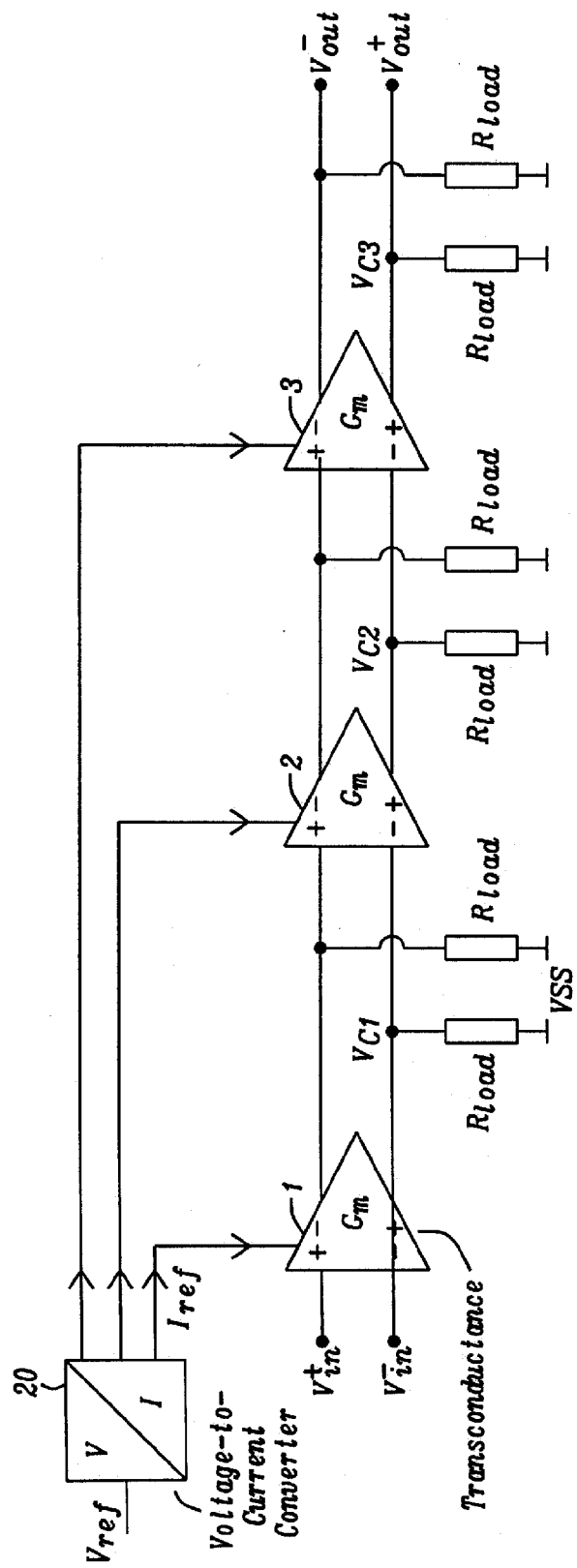
FIG. 2 shows another embodiment of the present invention having only one V-I converter.

FIG. 2 shows another embodiment of the present invention having only one V-I converter 20. It has also 3 amplifying stages comprising three OTAs 1-3 with load resistors RLOAD at each stage output. Each transconductance 1-3 comprises a differential pair of MOSFETs (as shown in FIG. 3 in detail). The current of each differential pair can be supplied by one shared V-I-converter 20 if the V-I-converter has a current mirror with 3 output current sources. The common mode voltage of each of the 3 gain stages is simultaneously adjusted with the reference voltage and the V-I-converter 20.

FIG. 3 illustrates a preferred embodiment of a voltage to current (V-I) converter 30 connected to transconductance 32 (differential stage) with resistor load RLOAD. The reference resistor $R_{ref}$ and the load resistors RLOAD are of the same type, for instance both resistors are made of poly silicon, and are made of the same unit elements and are probably matched in chip layout, so that there is a fixed ratio between $R_{ref}$ and $R_{load}$: $R_{load}/R_{ref}$=k.

The parameter k can be smaller or larger than 1.

The V-I-converter 30 generates a reference current $I_{ref}=V_{ref}/R_{ref}$, assuming a ratio of current mirror 31 of 1:1. (The current mirror ratio of the 2 PMOSFET transistors of current mirror 31 must not be necessarily 1:1). The common mode voltage (i.e. $V_{in}^-=V_{in}^+$) at $V_{out}^-$ and $V_{out}^+$ is $V_{com}=R_{load} \times I_{Rload}=R_{load}*I_{ref}/2=V_{ref}*k/2$. The common mode voltage is independent of the resistor material and global resistor variation; it just depends on the reference voltage, the current mirror ratio (of the 2 voltage-to-current converter PMOSFETs), and the resistor ratio k. No common mode feedback loop is required.

In the preferred embodiment of the invention chopper switches are deployed in order to reduce noise, modulating the input and demodulating the output of the amplifier. Alternatively nested chopping or autozeroing could also be used to reduce noise.

FIG. 4 illustrates a white noise curve 42 and a 1/f noise curve 41 depending upon the frequency. The frequency of the chopper switches is set depending on a crossover 40 of the 1/f curve 41 and the white noise curve 42 as shown in FIG. 4, namely well above this crossover point, e.g. at frequency point 43. A design goal of the amplifier is to have the crossover point 40 as low as possible. Therefore resistors have been used to form a load of the gain stages and with the exception of the chopper switches only PMOS transistors have been deployed. In the preferred embodiment the chopper frequency can be set below 1 kHz and the crossover point is in the order of magnitude of 100 Hz, i.e. much under the chop frequency.

Figure 5:
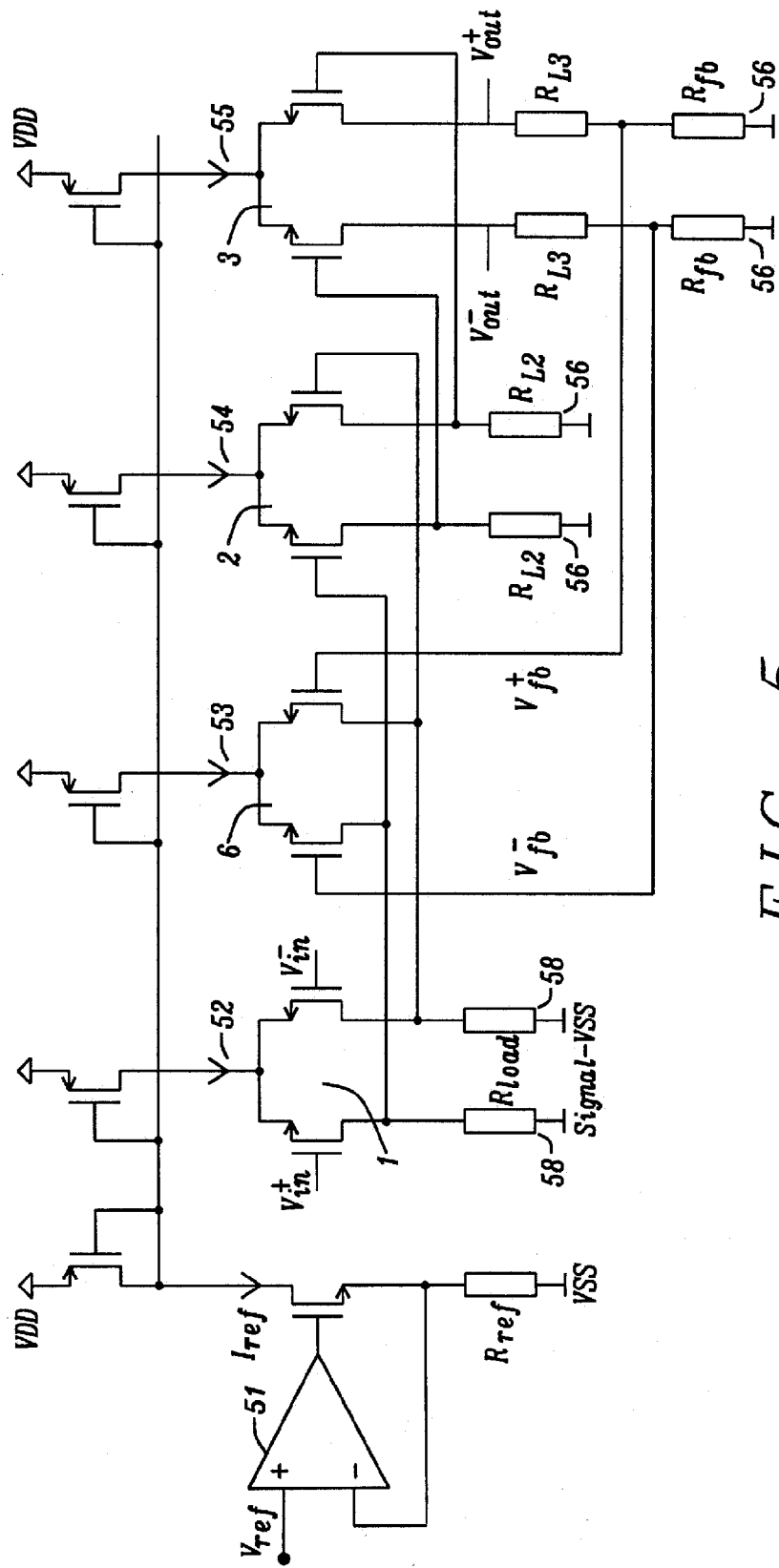
FIG. 5 illustrates a block diagram showing basic functions of a preferred embodiment of the invention having three gain stages 1-3, indicating connections to "signal VSS".

FIG. 5 illustrates a block diagram showing basic functions of a preferred embodiment of the invention having three gain stages 1-3, indicating connections to "signal VSS". The same numerals have been used in FIG. 5 as in FIG. 1. The resistors $R_{load}$ of the Input differential pair 1 are connected to a signal VSS, the resistor $R_{ref}$ of the voltage-to-current converter 51 is connected to VSS. The pair of resistors RL2 of the second stage 2 and the pair of resistors RL3 of the third stage 3 could be connected to signal VSS or the VSS.

In case of an automotive application of the amplifier a car chassis could be used as this "signal ground" or "signal VSS". The separation of VSS voltage level and signal VSS voltage level enables a common mode input enclosing VSS and an input signal to be amplified from VSS level upwards.

Figure 6:
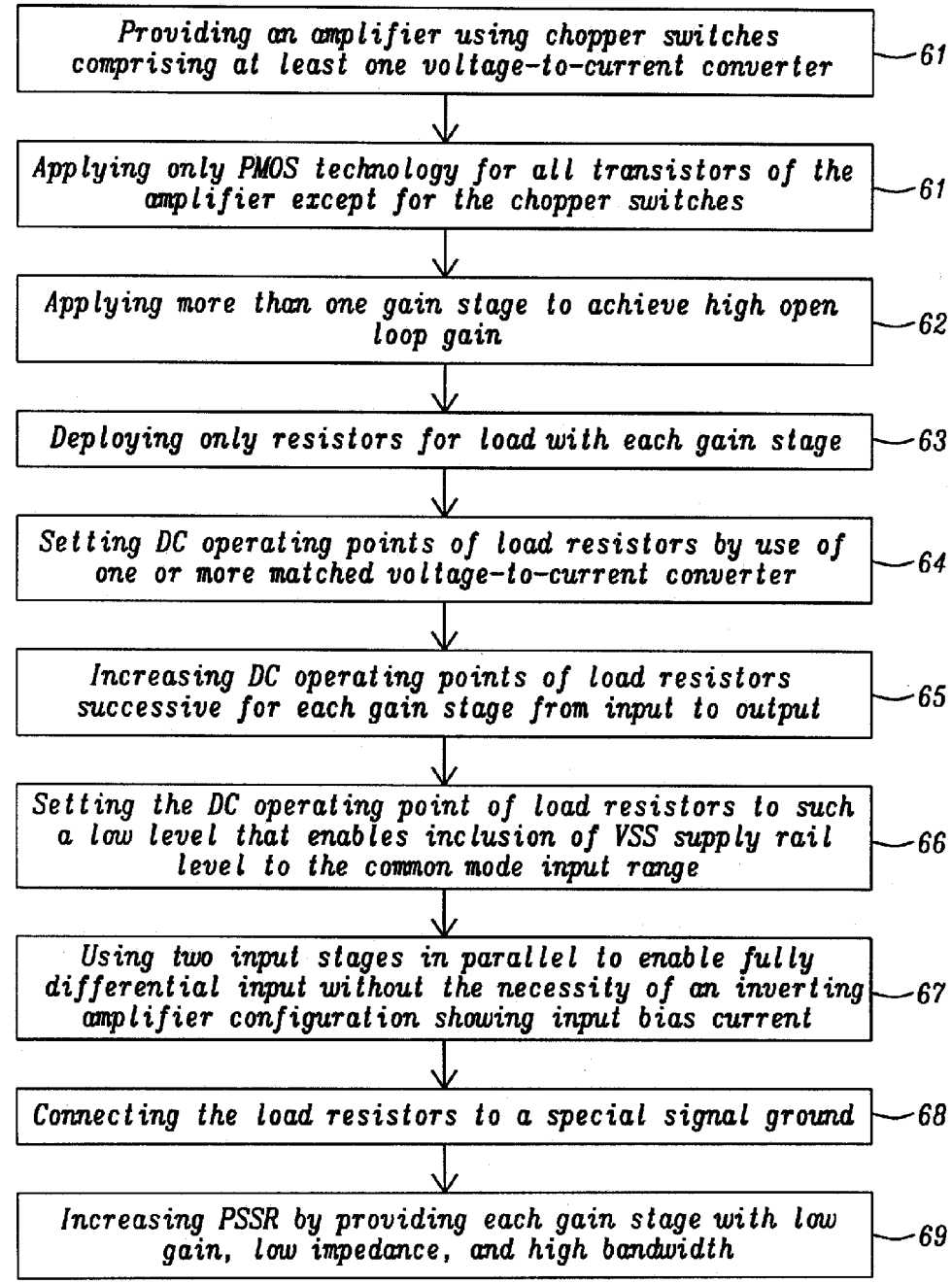
FIG. 6 illustrates a flowchart of a method invented to achieve a low noise amplifier suited for amplification of low frequency signals.

FIG. 6 illustrates a flowchart of a method invented to achieve a low noise amplifier suited for amplification of low frequency signals. A first step 60 describes the provision of a fully differential amplifier comprising at least one voltage-to-current converter each comprising an impedance defining the voltage to current ratio, wherein the impedance of the voltage-to-current converter matches to with load impedances of at least one or more gain stages. The following step 61 illustrates applying only one type of transistors of an IC technology that has the lowest transition frequency between 1/f noise and white noise to achieve a low chopping or autozeroing frequency. Step 62 teaches deploying load impedances with each gain stage. Step 63 shows adjusting common mode voltages by adjusting currents flowing through said load impedances, wherein the currents flowing through the load impedances are derived from the at least one voltage-to-current converter and wherein no common mode feedback loop is required. Step 64 illustrates setting the common mode voltage at the load impedances of a first stage small enough so that the input common mode range encloses the ground potential. Step 65 describes connecting the load impedances to a special signal ground.

While the invention has been particularly shown and described with reference to the preferred embodiments thereof, it will be understood by those skilled in the art that various changes in form and details may be made without departing from the spirit and scope of the invention.

What is claimed is:

1. A method to achieve a fully differential low noise amplifier with controlled common mode voltages suited for amplification of low frequency signals, comprising the following steps:
   (1) providing a fully differential amplifier having one or more gain stages comprising at least one voltage-to-current converter each comprising an impedance defining the voltage to current ratio, wherein the impedance of the voltage-to-current converter matches load impedances of the one or more gain stages;
   (2) applying only one polarity of transistors of an IC technology that has the lowest transition frequency between 1/f noise and white noise to achieve a low chopping or autozeroing frequency;
   (3) deploying load impedances with each gain stage; and
   (3) adjusting common mode voltages by adjusting currents flowing through said load impedances, wherein the currents flowing through the load impedances are derived from the at least one voltage-to-current converter and wherein no common mode feedback loop is required.

2. The method of claim 1 wherein a crossover point of the amplifier is in the order of magnitude of 100 Hz.

3. The method of claim 1 wherein the low frequency signals have range between 0-80 Hz.

4. The method of claim 1 wherein the amplifier has a noise density below 30 nV/√Hz.

5. The method of claim 1 wherein the amplifier has three gain stages.

6. The method of claim 1 wherein the common mode DC operating of the outputs of multiple gain stages are different from common mode DC OP from the input.

7. The method of claim 1 wherein the common mode DC operating of the outputs of multiple gain stages are higher than common mode DC OP from the input.

8. The method of claim 1 wherein one terminal of a shunt at the input of the amplifier is also connected to said signal ground.

9. The method of claim 1 wherein a first gain stage comprises two transconductances whose outputs are connected in parallel to the load impedances of the first stage, instead of using two input stages in parallel, two transconductances are deployed in parallel in order to enable fully differential input without requiring an inverting amplifier configuration.

10. The method of claim 1 wherein each gain stage comprises one transconductance.

11. The method of claim 1 wherein the load impedances are made of transistors operated as resistors.

12. The method of claim 1 wherein the load impedances are made of inductors.

13. The method of claim 1 wherein the load impedances are made of diodes.

14. The method of claim 1 wherein the load impedances are made of transistors working as diodes.

15. The method of claim 1 wherein the load impedances are made of MOS diodes.

16. The method of claim 1 wherein the load impedances are resistors.

17. The method of claim 16 wherein all the load resistors and each reference resistor of said one or more voltage-to-current converters are of a same type.

18. The method of claim 1 wherein common mode DC operating points of the load impedances are successively increased for each gain stage from input to output.

19. The method of claim 1 wherein PSSR is increased by providing each gain stage with low gain, low impedance and high bandwidth.

20. The method of claim 1 wherein a pair of load impedances of a first gain stage is connected to a signal VSS level.

21. A fully differential amplifier with at least one gain stage and a controlled common mode voltage, comprises:
at least one gain stage that is built of a differential transconductance connected to a load impedance, wherein the differential transconductance is connected to the input of the gain stage, and the output of the differential transconductance and the load impedance are connected to the output of the gain stage; and
at least one voltage-to-current converter comprising an impedance defining a voltage to current ratio, where the impedance of the at least one voltage-to-current converter matches with the load impedance of one or a number of gain stages, wherein common mode voltages are adjusted by adjusting currents flowing through the load impedances, whereupon the currents are derived from said at least one voltage-to-current converter based on an impedance that matches to the load impedance of the at least one gain stage of the amplifier, and wherein the common mode voltage is controlled without requiring a means to measure the output common mode voltage.

22. The amplifier of claim 21 wherein the differential transconductance is made of a differential transistor pair connected to a current source that is controlled by said at least one voltage-to-current converter.

23. The amplifier of claim 21 wherein the load impedances are resistors connected to a common ground signal.

24. The amplifier of claim 21 wherein a common mode output voltage of a gain stage is controlled by exactly one bias current generated by one of said at least one voltage-to-current converter based on an impedance matching the impedance of that one gain stage.

25. The amplifier of claim 21 wherein the common mode output voltage of at least two gain stages are controlled by one common bias current by one of said at least one voltage-to-current converter based on an impedance matching with the impedances of all gain stages, whose bias currents are controlled by this voltage-to-current converter.

26. The amplifier of claim 21 wherein the load impedances are transistors operated as resistors.

27. The amplifier of claim 21 wherein the load impedances are inductors.

28. The amplifier of claim 21 wherein the load impedances are diodes.

29. The amplifier of claim 21 wherein the load impedances are transistors working as diodes.

30. The amplifier of claim 21 wherein the load impedances are MOS diodes.

31. The amplifier of claim 21 wherein a first gain stage comprises two transconductances whose outputs are connected in parallel to the load impedances of the first stage, and wherein the differential inputs of one of the tranconductances is used as an input of the amplifier, and differential inputs of the other one of the transconductances is used as input for a feedback signal.

32. The amplifier of claim 21 wherein a first gain stage comprises two transconductances whose outputs are connected in parallel to the load impedances of the first stage, and wherein the differential inputs of one of the tranconductances is used as an input of the amplifier, and differential inputs of the other one of the transconductances is used as input for a secondary signal.

33. The amplifier of claim 21 wherein the load impedances of the last gain stage have an intermediate tap for a feedback signal.

34. The amplifier of claim 21 wherein the load impedances are connected to a special signal ground.

35. The amplifier of claim 34 wherein the load impedances of the gain stages are connected to a common signal ground that is separated from other signal grounds of surrounding circuitry forming an amplifier insensitive to noise on the common signal ground.

36. The amplifier of claim 21 wherein only one conduction type of transistors of an IC-technology is used, that has the lowest transition frequency between 1/f-noise and white noise to achieve a low chopping or autozeroing frequency.

37. The amplifier of claim 21 wherein the common mode voltage at a tap at the load impedances of the last gain stage is equal to the common mode input voltage of a secondary transconductance input of a first gain stage by correctly adjusting the common mode voltage at the load impedances of the first gain stage and the operating range of the transistors of the transconductance of the first stage of the common mode voltage at the feedback tap of the last gain stage.

38. The amplifier of claim 21 wherein the frequency compensation is achieved by compensation performed in one stage.

39. The amplifier of claim 21 wherein only PMOS transistors are used for the transconductances and the common mode voltage at the load impedances of a first stage is small enough so that the input common mode range encloses the ground potential.

40. The amplifier of claim 21 wherein the amplifier is used in a chopped amplifier.

41. The amplifier of claim 21 wherein the amplifier is used in a nested chopped amplifier.

42. The amplifier of claim 21 wherein the amplifier is used in an autozeroed chopped amplifier.

43. The amplifier of claim 21 wherein the impedance defining a voltage to current ratio at the least one voltage-to-current converter is connected to VSS voltage.

44. The amplifier of claim 21 wherein the load impedances of a first gain stage, receiving an input voltage, are connected to signal VSS level.

45. A low-noise amplifier suited for amplification of low frequency signals, comprises:
- an input port for a positive signal;
- an input port for a negative signal:
- one or more voltage-to-current (V/I) converters providing currents to set a DC operating point of load resistors of one or more gain stages, wherein each V/I converter comprises an input port for a reference voltage and a reference resistor, wherein the reference resistor is of a same conduction type as all load resistors;
- said one or more fully differential gain stages, wherein all transistors of said at least two gain stages are PMOS transistors and each gain stage has exclusively all said matched load resistors for load, each load resistor has one terminal connected to a signal ground, and wherein each gain stage comprises at least one transconductance;
- a positive output node;
- a negative output node;
- a feedback circuit comprising a voltage divider, formed by splitting the load resistors of an output gain stage, feeding back a fraction of the output voltages, wherein the fraction of the positive and negative output voltages is an input of a fully differential transconductance, which is in parallel to the transconductance of the first gain stage and is feeding the same load resistors as the transconductance of the first gain stage.

46. The amplifier of claim 45 wherein its noise density is below 30 nV/√Hz.

47. The amplifier of claim 45 wherein the frequency of the chopper switches is below 1 kHz.

48. The amplifier of claim 45 wherein the amplifier is enabled to amplify signals ranging from 0-80 Hz.

49. The amplifier of claim 45 wherein an exact adjustment of common mode of resistor load and common mode input is achieved by matching the one or more V/I converters.

50. The amplifier of claim 45 wherein a first V/I converter provides current to set a DC operating point for the load resistors of a first gain stage and a second V/I converter sets the currents for the load resistors of all following gain stages.

51. The amplifier of claim 45 wherein said the amplifier has three gain stages.

52. The amplifier of claim 45 wherein a shunt resistor is deployed at the input of the amplifier wherein one terminal is connected to the signal ground.

53. The amplifier of claim 45 wherein DC operating points of load resistors are set by setting the common mode voltage of each gain stage by separate matched V/I converters.

54. The amplifier of claim 53 wherein the operation mode voltages are successively increased with gain stages from input stage to output stage.

55. The amplifier of claim 45 wherein the load impedances of a first gain stage, receiving an input voltage, are connected to signal VSS level.

* * * * *